United States Patent [19]
Briner

[11] Patent Number: 5,757,697
[45] Date of Patent: May 26, 1998

[54] METHOD FOR SENSING THE BINARY STATE OF A FLOATING-GATE MEMORY DEVICE

[75] Inventor: Michael S. Briner, San Jose, Calif.

[73] Assignee: Micron Quantum Devices, Inc., Santa Clara, Calif.

[21] Appl. No.: 893,282

[22] Filed: Jul. 15, 1997

Related U.S. Application Data

[60] Continuation of Ser. No. 572,097, Dec. 14, 1995, abandoned, which is a division of Ser. No. 387,017, Feb. 10, 1995, abandoned.

[51] Int. Cl.$^6$ ............................................. G11C 16/06
[52] U.S. Cl. ............................. 365/185.21; 365/185.25; 365/185.2
[58] Field of Search ...................... 365/185.21, 185.25, 365/185.2

[56] References Cited

U.S. PATENT DOCUMENTS

| | | | |
|---|---|---|---|
| 4,223,394 | 9/1980 | Pathak et al. | |
| 4,654,831 | 3/1987 | Venkatesh | |
| 5,197,028 | 3/1993 | Nakai | 365/185.21 |
| 5,253,210 | 10/1993 | Terada | 365/185.21 |
| 5,258,958 | 11/1993 | Iwahashi et al. | 365/185.21 |
| 5,262,984 | 11/1993 | Noguchi et al. | 365/185.21 |
| 5,293,333 | 3/1994 | Hashimoto | 365/185.21 |
| 5,293,345 | 3/1994 | Iwahashi | 365/185.21 |
| 5,301,149 | 4/1994 | Jinbo | 365/185.21 |
| 5,305,273 | 4/1994 | Jinbo | 365/185.21 |
| 5,381,374 | 1/1995 | Shiraishi et al. | 365/185.25 |
| 5,386,158 | 1/1995 | Wang | 365/185.21 |
| 5,388,078 | 2/1995 | Arakawa | 365/185.21 |
| 5,519,652 | 5/1996 | Kumakura et al. | 365/185.21 |
| 5,530,671 | 6/1996 | Hashimoto | 365/185.21 |
| 5,544,114 | 8/1996 | Gaultier et al. | 365/185.25 |

FOREIGN PATENT DOCUMENTS

A0 199501   10/1986   European Pat. Off. .

OTHER PUBLICATIONS

IEEE Journal of Solid-State Circuits, vol. 22, No. 5, Oct. 1987, New York, pp. 684–692, Cioaca et al: "A Million cycle CMOS 256K EEPROM".

IEEE Journal of Solid-State Circuits, vol. 24, No. 5, Oct. 1989, New York, pp. 1244–1249, Terada et al: "120ns 128k x 8–bit/64k x 16–bit CMOs EEPROMs".

IEEE Proceedings of the 1992 Custom Integrated Circuits Conference, 3–6 May 1992, Boston.

*Primary Examiner*—Huan Hoang
*Attorney, Agent, or Firm*—Schwegman, Lundberg, Woessner & Kluth, P.A.

[57] ABSTRACT

A fast-sensing amplifier for a flash memory comprised of a plurality of floating-gate memory devices and having a column line selectively coupled to the devices is disclosed. The column line is quickly discharged to ground before a read-biasing and amplifying circuit quickly pulls up the line to the read-bias potential at a particular memory device. This potential is compared to a sense-reference potential by a differential amplifier within the fast-sensing amplifier. The binary state of the particular memory device is provided as the output of the fast-sensing amplifier.

6 Claims, 8 Drawing Sheets

METHOD FOR SENSING THE BINARY STATE OF A FLOATING-GATE MEMORY DEVICE

This application is a continuation of U.S. patent application Ser. No. 08/572,097, filed on Dec. 14, 1995, now abandoned, which is a division of U.S. patent application Ser. No. 08/387,017, filed on Feb. 10, 1995, now abandoned.

FIELD OF THE INVENTION

The present invention relates generally to the field of electrically programmable and electrically erasable read-only memories, and more particularly, to a fast-sensing amplifier for a flash memory device.

BACKGROUND OF THE INVENTION

In recent years, the use of personal computers has grown tremendously in nearly all aspects of society. Personal computers typically comprise a microprocessor chip, random access memory, and non-volatile memory. Non-volatile memory is memory that retains its stored information even when power is no longer supplied to the chip. One type of non-volatile memory is flash memory, which can be both erased and programmed electrically.

In non-volatile complementary metal-oxide semiconductor (CMOS) read-only flash memories employing floating-gate memory devices, a memory array consisting of a number of these devices is customarily coupled to a common sensing circuit through a column line connecting the drains of the individual memory devices and a word line connecting the gates of the devices in the array, to comprise a memory circuit. Typically a charged column line remains charged if the memory device coupled to it is nonconductive. If coupled to a conductive memory device, the line discharges. The sensing circuit, or amplifier, determines the binary state (conductive or nonconductive) of the memory device based on whether the line is charged or not.

A floating-gate memory device typically requires limiting the maximum potential at the column line to a potential significantly less than the voltage applied to the word line during read, or sense, operations. This minimizes disturbing the data stored on the floating gate of a device during read operations. Usually within a non-volatile flash memory device, the voltage swing on the column line between a high binary state and a low binary state is quite small. This reduction in voltage swing on the capacitive load on the column line of the memory array decreases the access time needed to determine the binary state of a device, but brings about the need for an amplifier circuit to further separate the swing between a low binary state and a high binary state. The amplifier circuit also limits the maximum voltage at the column line during read operations. Although using an amplifier circuit itself adds an amplifying step that increases access time, the net effect still serves to decrease access time as compared to a memory circuit with no amplifier but having a large voltage swing on the large capacitance of the memory column lines. This is because minimizing the voltage swing between a high and low binary state typically reduces read-access time more than the inclusion of an amplifying step increases access time.

FIG. 1A is a system-level depiction of one prior art approach to CMOS high-speed sensing. The sensing circuit, or amplifier, consists of two read-biasing and amplifying circuits coupled to a differential amplifier. Generally, after the column line of a desired memory device within the memory array is selected, the differential amplifier compares the charge, or voltage, of the selected device to a sensing-reference charge, or voltage. The differential amplifier amplifies the difference between the voltage at the selected memory device and the sensing-reference voltage. This difference corresponds to the binary state of the device.

In a typical read, or sensing, operation, the column line of the memory array often discharges substantially when coupled to a conductive memory device. Before another read cycle can occur, the line must be recharged. The recharging period retards access time in these memory circuits because of the considerable parasitic capacitance generally associated with the lines. The greater capacitance of longer lines exacerbates this problem in larger memory circuits. A drawback of the prior art is that the capacitance of the reference column effectively doubles the capacitance that needs to be recharged. In some instances, this delays access time over the time needed just to recharge the column line of the selected memory device.

FIG. 1B depicts in further detail one prior art approach to implementing the read-biasing and amplifying circuit in FIG. 1A. Transistors P1, P2, P3, N1, N2, and N3 make up a typical amplifier with feedback biasing, to maintain the selected column line at a stable voltage during sensing. Prior to a read operation, CP, a clock pulsed high, discharges the selected column line to ground. During this time, transistor N12 isolates the column line of the selected memory device from the biasing circuit. Upon CP going low, the memory device reconnects to the biasing circuit, and transistor N2 quickly charges the column line to near the sensing-reference level. The feedback path then turns N2 off and current-loading transistor P3 supplies the final charging current.

Another drawback to the prior art is the complexity of this read-biasing and amplifying circuit. The large number of transistors in the amplifying circuit, consisting of transistors N1, N2, N3, P1, P2, and P3, lengthens memory read-access time due to the parasitic capacitances of the transistors themselves and the delays they cause. Still another drawback is that isolating the memory array from the biasing circuit before a read operation via transistor N12 further delays read-access time. Moreover, N12 loads the circuit with additional capacitance, which also increases access time.

SUMMARY OF THE INVENTION

The present invention provides for a fast and efficient MOS sensing amplifier for sensing the binary state of floating-gate memory devices within a floating-gate memory array having a column line selectively coupled to the devices. Prior to sensing, the column line discharges quickly to ground. During a sense operation, a read-biasing and amplifying circuit quickly pulls up the column line to the sense potential at the selected memory device. A differential amplifier compares this sensed potential to a sense-reference potential, providing as output the binary state of the selected memory device.

The above summary of the present invention is not intended to present each embodiment or every aspect of the present invention. This is the purpose of the figures and the associated description that follow.

BRIEF DESCRIPTION OF THE DRAWINGS

Other aspects and advantages of the present invention will become apparent upon reading the following detailed description and upon reference to the drawings described below.

Figure 1A:
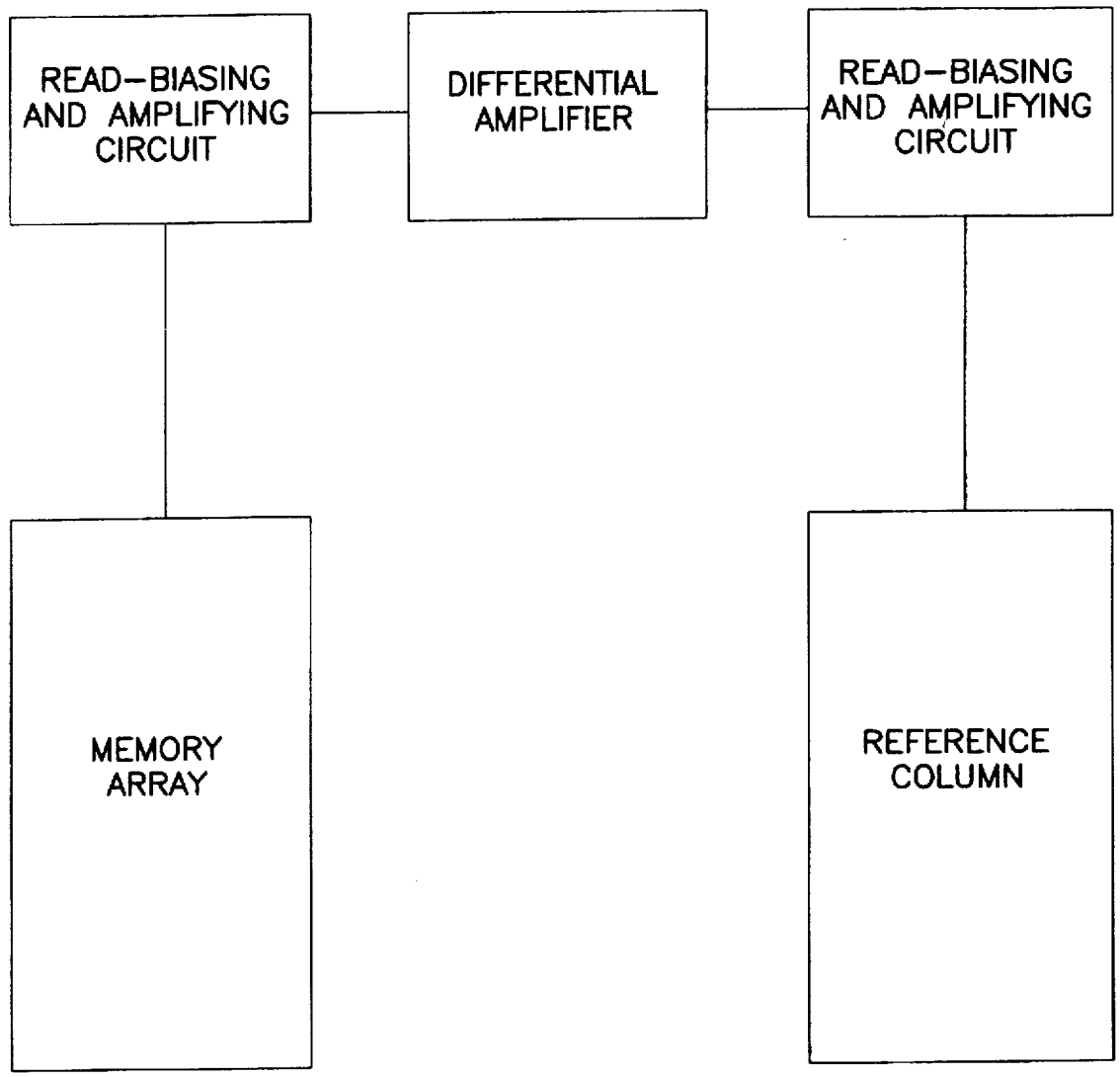
FIG. 1A is an electrical schematic showing on a system level a prior art sensing means for flash memory.
Figure 1B:
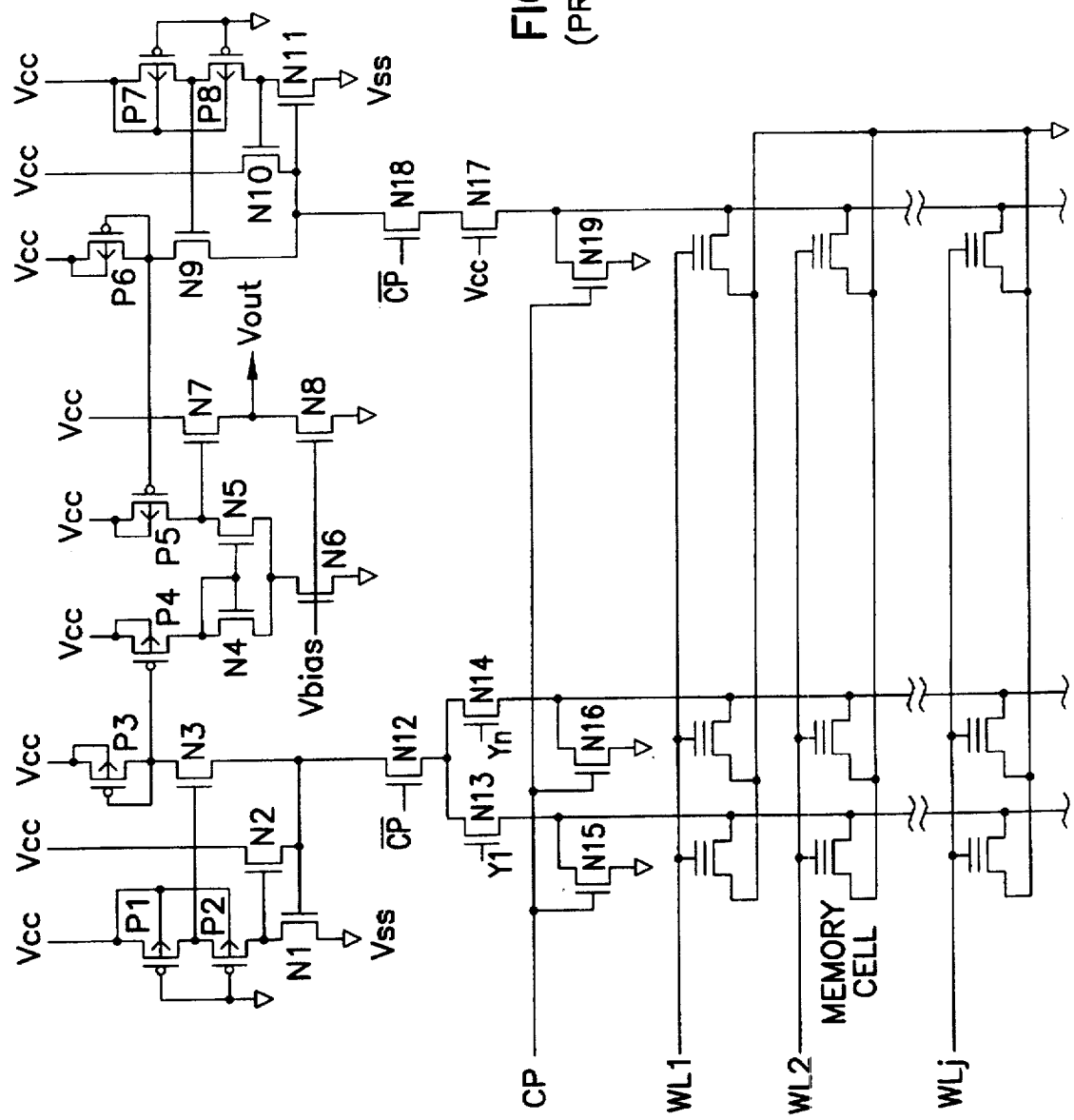
FIG. 1B is an electrical schematic showing in more detail the prior art sensing means of FIG. 1A.

While the invention is susceptive to various modifications and alternate forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE PREFERRED EMBODIMENTS

Figure 4:
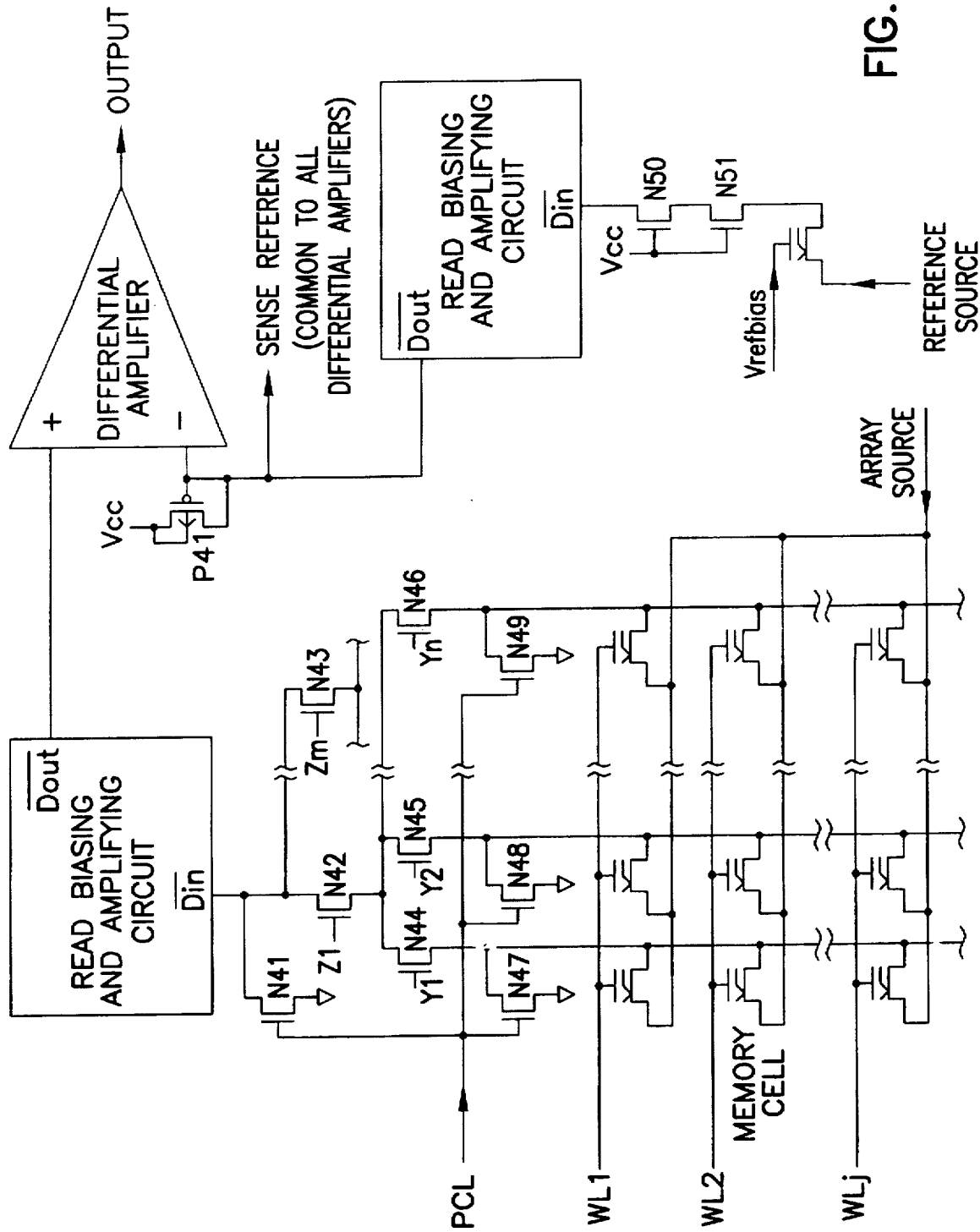
FIG. 4 is an electrical schematic showing a high-speed sensing circuit compatible with the present invention.

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention. For instance, the present invention has application in connection with non-volatile read-only memory erasable by ultraviolet light and electrically programmable (EPROM) and also electrically erasable and programmable read-only memory (EEPROM) chips. In addition, the difference amplifier circuits for sensing the difference between the target memory cell and the reference memory cell may be implemented using various forms of active or passive circuits, and the respective circuits providing the input and output signals may be implemented in a number of modified forms. The preferred circuits depicted in FIG. 4 show an exemplary arrangement and use a high-speed sensing circuit in accordance with the present invention, but it should be recognized that other circuits may be implemented within the scope of the present invention without loss of generality.

Figure 2:
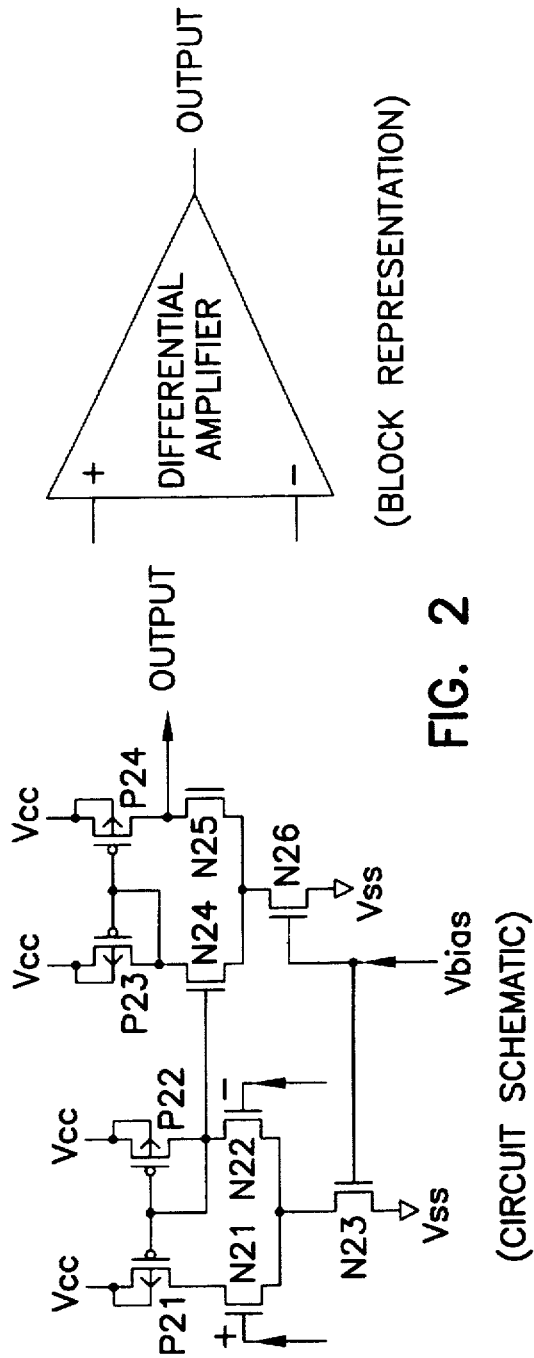
FIG. 2 is an electrical schematic showing a differential amplifier circuit compatible with the present invention.

FIG. 2 depicts a typical differential amplifier circuit that may be used with the present invention. The difference amplifier has a first input line, a second input line, and an output line. A sensing reference signal from a reference memory cell is compared to a source signal from one of the memory array column lines, and the binary state of the source memory cell is the output of the amplifier. The source and n-well of p-channel metal-oxide semiconductor field-effect transistors (MOSFETs) P21 and P22 are coupled to a predetermined voltage Vcc, with the gates of P21 and P22 coupled to the drain of P22 and the drain of n-channel MOSFET N22 and the gate of n-channel MOSFET N24. The drain of P21 couples to the drain of n-channel MOSFET N21 and the gate of n-channel MOSFET N25. The first input line is coupled to the gate of N21, and the second input line is coupled to the gate of N22. The sources of N21 and N22 are connected to the drain of n-channel MOSFET N23, which has its source coupled to predetermined voltage Vss and its gate coupled to predetermined voltage Vbias and the gate of n-channel MOSFET N26. N26 has its source coupled to Vss, with its drain coupled to the sources of N24 and N25. The source and n-well of p-channel MOSFETs P23 and P24 are coupled to a predetermined voltage Vcc, with the gates of P23 and P24 coupled to the drain of P23 and the drain of N24. The drain of P24 is coupled to the drain of N25 and the output line.

The difference amplifier separates further the relatively low voltage swing between a binary high state and a binary low state that may be stored in a memory device. The reference memory device will supply at the negative (−) input of the differential amplifier a predetermined sensing-reference voltage upon Vbias going high. The selected memory device within the memory array will supply at the positive input a voltage either slightly lower or slightly higher than the reference voltage, depending on whether the device represents a binary low or binary high state, respectively.

If the memory device represents a binary low state, the voltage it supplies to the positive input of the differential amplifier will be slightly less than the voltage supplied by the reference device to the negative input. The difference between the voltage supplied by the device and the voltage supplied by reference device will be slightly less than zero. The output of the differential amplifier will therefore be low, because the voltage across the positive and negative terminals is not a positive voltage.

If the memory device represents a binary high state, the voltage it supplies to the positive input of the differential amplifier will be slightly greater than the voltage supplied by the reference device to the negative input. The difference between the voltage supplied by the device and the voltage supplied by the reference device will be slightly higher than zero. The output of the differential amplifier will therefore be high, because the voltage across the positive and negative terminals is positive.

Figure 3:
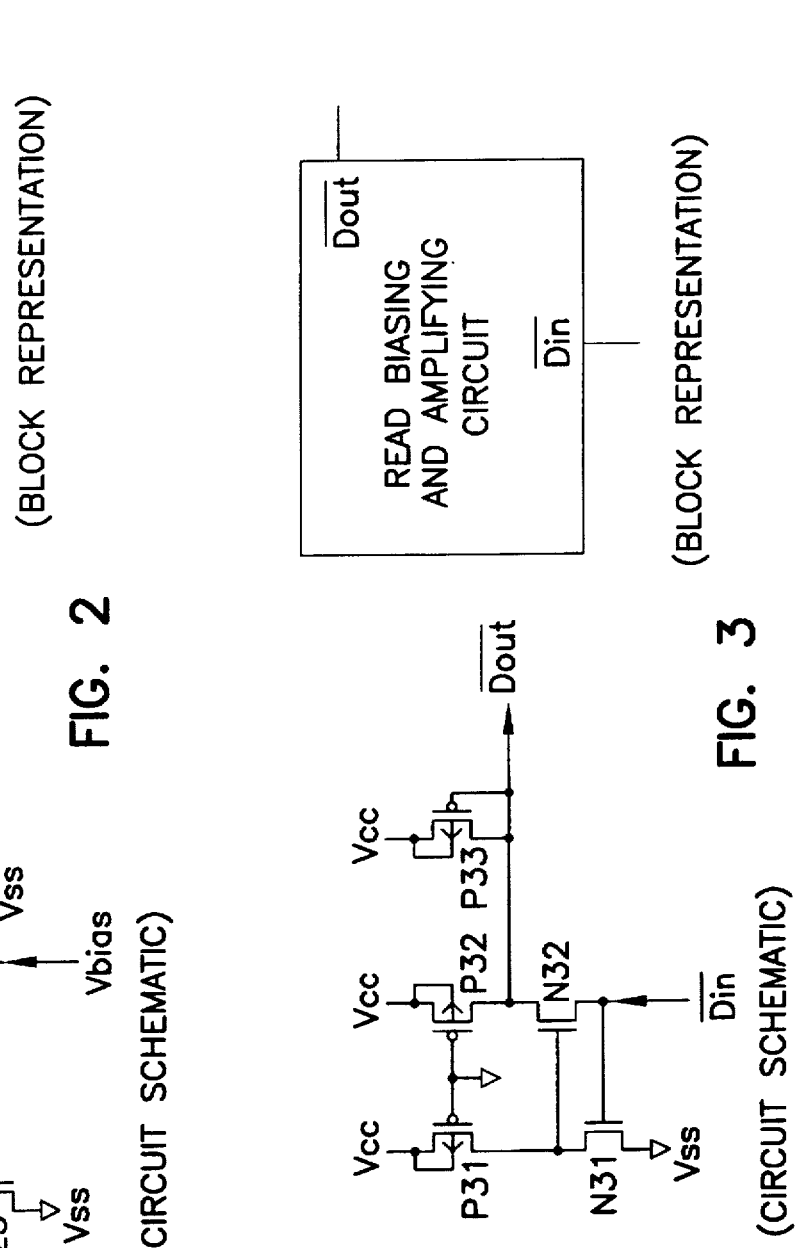
FIG. 3 is an electrical schematic showing a read-biasing and amplifying circuit compatible with the present invention.

FIG. 3 illustrates a new and novel read-biasing and amplifying circuit compatible with the present invention. The read-biasing and amplifying circuit has an input line Din and an output line Dout. P-channel MOSFETs P31, P32, and P33 each have their source and n-well coupled to the predetermined voltage Vcc. The gates of P31 and P32 couple to each other and the predetermined voltage Vss, and the drains of P32 and P33 couple to each other and the gate of P33 and Dout. The source of n-channel MOSFET N31 couples to the predetermined voltage Vss, and the drain of N31 couples to the gate of n-channel MOSFET N32 and the drain of P31. The gate of the N31 couples to Din and the source of N32. The drain of the N32 couples to the drains of P32 and P33 and the gate of P33 and Dout.

The read-biasing and amplifying circuit used is a new and novel approach. The quick-charging transistor for biasing the bit line for sensing is the p-channel transistor, P33. This device operates in the saturated region of operation for quick charging of the bit line and is "off" during sensing. During sensing, transistor P32, which is in the linear region of operation, provides current and acts as the load for the memory cell being sensed. Transistors N31, N32 and P31 form a feedback biasing circuit which limits the bit line voltage during sensing. Limiting the bit line voltage during read operations is required by the floating-gate memory cells to prevent read disturbs. This circuit is an improvement over prior art because the feedback biasing circuit consists of only three transistors, rather than five or more as in prior art, and therefore is faster. Having a fast feedback path is also important in preventing overshoot of the bit line during charging because overshoot can cause additional delays during sensing. Furthermore, the quick-charging device not only charges the bit line node but also provides quick charging of the read-biasing and amplifying circuit's output node, Dout. This again results in a speed improvement over the prior art. Also, with the sensing load operating in the linear, or resistive, region of operation rather than in saturation mode, the voltage differential to the differential amplifier is more linear with memory cell currents. This results in a more equal voltage difference for the same amount of current difference between the reference current and the memory cell stored "one" and "zero" states.

Within the preferred embodiment of the invention, the new and novel biasing circuit acts to quickly pull up the input line to the bias potential needed during the sensing of the data stored on a selected memory device, and to prevent overshoot on this line that would otherwise result from such a fast pull up. The input line Din initially discharges to ground. Afterwards, with transistor P32 serving as a load to the memory device coupled to the input line, transistor P33 acts as a quick-charging device to quickly pull the input line up to the read-bias potential used in reading the selected memory device. The feedback circuit comprised of transistors N31, P31, and N32 prevent the input line from overshooting the read-bias potential on the memory device coupled to the line.

For example, if the selected memory device coupled to the line input Din has no charge on its gate (corresponding to a logic zero), the device will conduct. Transistor P33 will quickly raise the potential at the line until transistor N31 turns on, which in conjunction with transistors P31 and N32 will ensure that the potential at the input line does not rise above Vss plus the threshold voltage of transistor N31. By preventing the input line from rising above this potential, the feedback circuit limits the maximum voltage in the bit lines at the memory cells. Dout will stabilize at a predetermined voltage less than the reference voltage, and will output to the differential amplifier a potential representing binary low.

If on the other hand the selected memory device coupled to the line input Din has a negative charge on its gate (corresponding to a logic one), the device will either be off or will only slightly conduct, at a lesser current level than the reference device. Transistor P33 will quickly pull up the potential at the line until transistor N31 turns on, which in conjunction with transistors P31 and N32 will ensure that the potential at the input line does not rise above Vss plus the threshold voltage of transistor N31. Again, by preventing the input line from rising above this potential, the feedback circuit limits the maximum voltage on the bit lines of the memory cells. Dout will stabilize at a predetermine voltage greater than the reference voltage, and will output to the differential amplifier a potential representing binary high.

Figure 5:
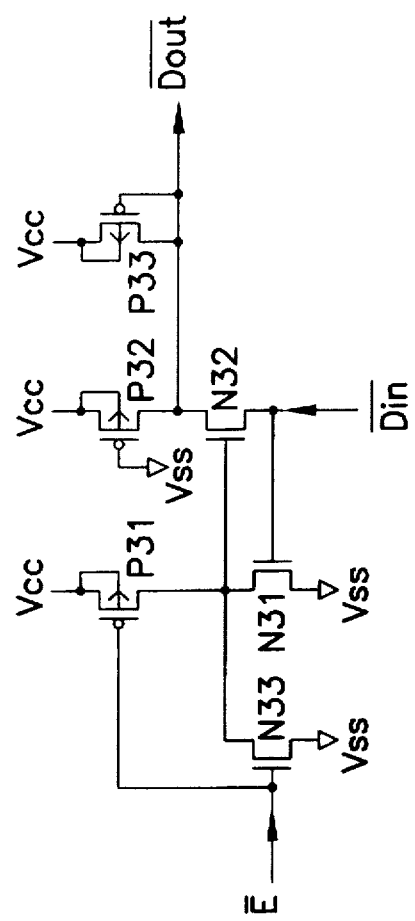
FIG. 5 is an electrical schematic showing an alternative embodiment read-biasing and amplifying circuit using a p-channel quick-charging transistor compatible with the present invention.

FIG. 5 shows an alternative embodiment with an enable control, $\overline{E}$. This sensing circuit operates similar to the preferred embodiment, except that the gate of P31 couples to an enable line, $\overline{E}$, and an additional n-channel MOSFET transistor N33 has its drain coupled to the gate of N32, its source coupled to Vss, and its gate also coupled to the enable line. Upon $\overline{E}$ going low, transistor P31 turns on and N33 turns off, which enables the feedback circuit to turn on when Din is coupled to a selected memory device. When $\overline{E}$ goes high, a sensing operation cannot occur. Transistor N33 turns on and P31 turns off, which in turn prevents transistor N32 from turning on. Since transistor N32 connects the quick-charging transistor P33 to the input line Din, if N32 does not turn on, then Dout will not reflect the potential at Din. Therefore, essential to the correct operation of the alternative embodiment is for $\overline{E}$ to go low when a sensing operation is to occur.

Figure 7:
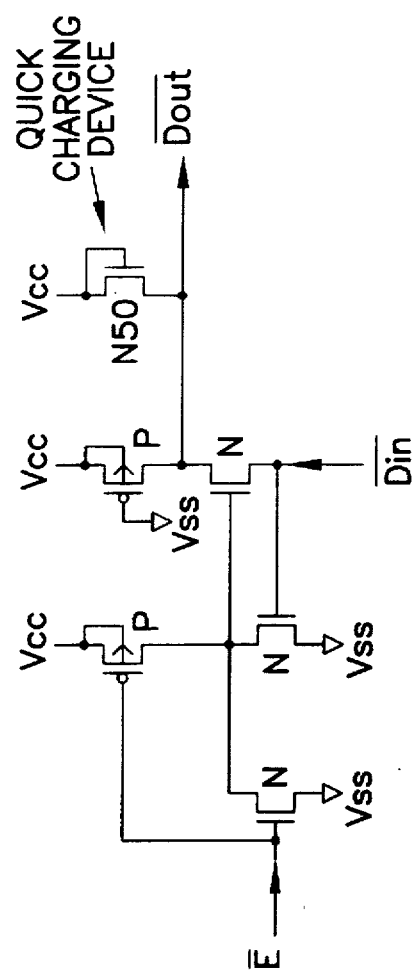
FIG. 7 is an electrical schematic showing an alternative embodiment read-biasing and amplifying circuit using an n-channel quick-charging transistor compatible with the present invention.

FIG. 7 shows yet another alternative embodiment with an enable control, $\overline{E}$. This alternative embodiment is identical to that depicted in FIG. 5, except that an n-channel MOSFET N50 supplants the p-channel transistor P33 in FIG. 5 as the quick-charging device. The drain and gate of transistor N50 couple to the predetermined voltage Vcc, while transistor N50's source couples to output line Dout. Other than this modification, the alternative embodiment of FIG. 7 operates identically to the embodiment portrayed in FIG. 5. Because n-channel transistors have a higher transconductance than p-channel transistors, employing an n-channel transistor as the quick-charging device results in less capacitive loading on the device itself (viz., less self-loading) than if using a p-channel transistor. The ensuing advantage is that the read-biasing and amplifying circuit operates more quickly than if the quick-charging device were a p-channel transistor.

In addition to the read-biasing and amplifying circuit, the invention comprising of the sensing arrangement described in FIG. 4. A sensing reference is provided by a p-channel MOSFET P41 with the source and n-well coupled to the predetermined voltage Vcc, and the gate and drain coupled to the second input line of the difference amplifier. A first read-biasing and amplifying circuit has its output line coupled to the gate and drain of the P41 and the second input line of the difference amplifier and a sense reference. N-channel MOSFETs N50 and N51 are coupled in series connection, with the gates of N50 and N51 being connected to the predetermined voltage Vcc, the drain of the N51 coupled to the source of the N50, and the drain of the N50 coupled to the input line of the first read-biasing circuit. A reference floating-gate memory device has the source coupled to a predetermined reference source, the gate coupled to a reference bias voltage Vrefbias, and the drain coupled to the source of transistor N51.

The sensing reference is not a reference column in the array, but rather is a single cell. It is biased with a voltage, Vrefbias, which controls the reference current to which the memory cells are compared. A single reference can be used by one or by multiple differential sense amps. In a typical implementation, a plurality of sense amplifiers can share a single reference. Since this results in more loading on the sense reference line, an additional quick-charging transistor, P41, may be added to the sense reference signal.

Figure 6:
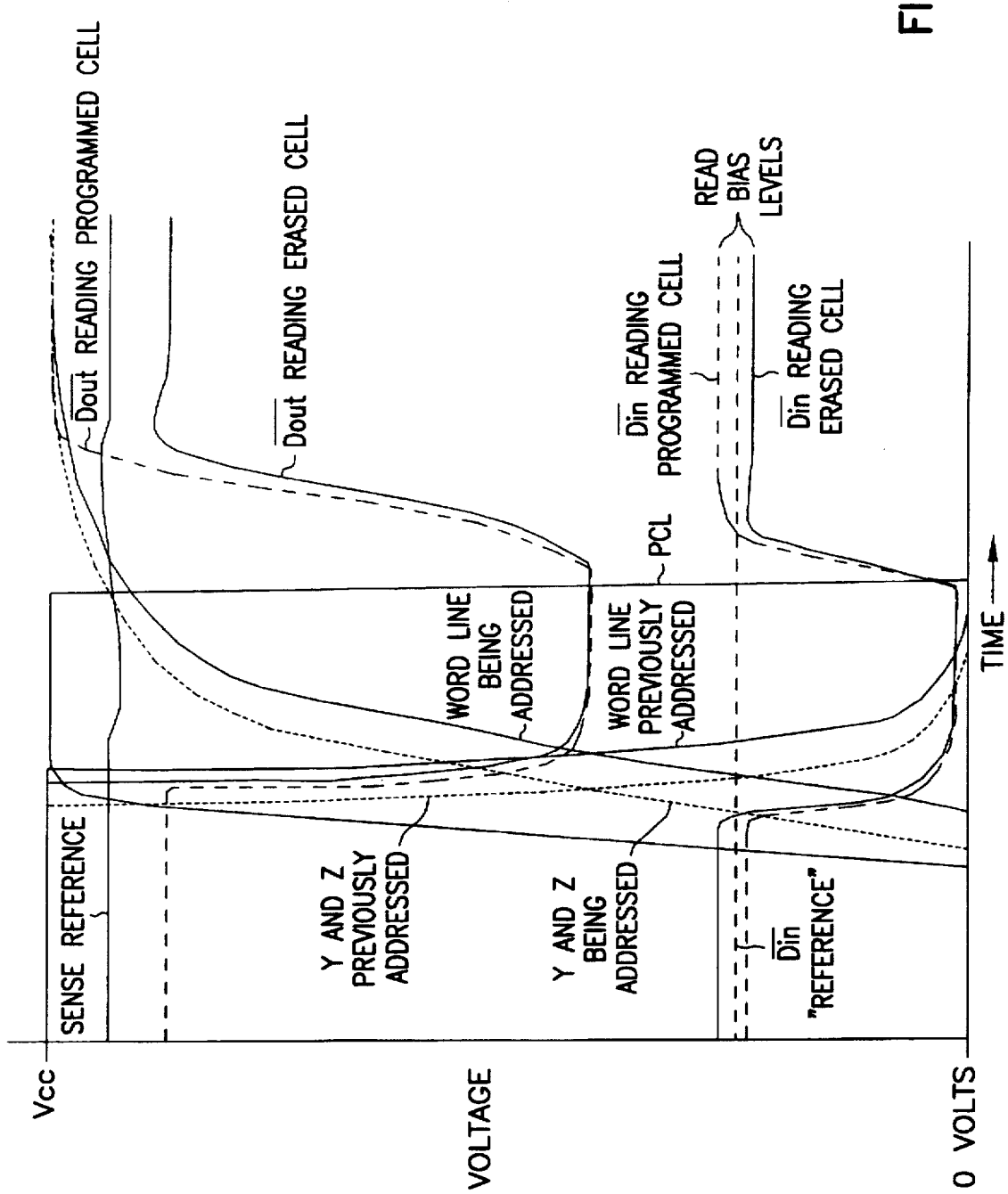
FIG. 6 is a waveform diagram showing the operation of the high-speed sensing circuit shown in FIGS. 3 and 4.

In this sensing-circuit, PCL, a clock pulsed high, pulls the bit lines low prior to sensing, as shown in FIG. 6. For improved performance, the bit lines are not disconnected from the read-biasing and amplifying circuit. This improves performance because the bit lines do not have any additional delay or loading from an isolation device gated by PCL. This does have the disadvantage of drawing current through the read-biasing and amplifying circuit during the time of pulling the bit lines low. However, this current can be controlled by proper sizing of the quick-charging devices. This arrangement has an additional speed advantage resulting from not using the memory cells to discharge the bit lines from the programmed cell read-bias level to the erased cell read-bias level. The additional speed advantage is achieved by bringing the addressed word line high while PCL is discharging the bit lines. Once PCL has gone low, the read-biasing and amplifying circuit will quickly pull the selected bit lines to the read-bias levels. If the memory cell being read is an erased cell, then it will be conducting current and the bit line will not be pulled as high as if the cell is programmed. A programmed cell is either conducting no current or significantly less current than the erased cell. The high-speed sensing comes from the combination of the bit lines being pre-charged low, while the word line is being accessed, and the strong pull up and biasing speed of the read-biasing and amplifying circuit.

In other words, the new and novel approach of the invention lies in quickly discharging the bit line to a potential close to ground, and then quickly charging the line back up to the read-bias levels without discharging the line with the selected memory devices. In the preferred embodiments, the bit line Din discharges to ground upon the clock pulse PCL going high. After the bit line goes low, and upon the clock pulse PCL going low, the sensing amplifier quickly pulls the potential of the line to the read-bias potential of the selected memory device. The feedback circuit of the sensing amplifier limits overshoot considerably. If the selected memory device carries no charge on its floating gate (viz., it is an "erased" cell), overshoot never exceeds the predetermined reference voltage. Furthermore, if the selected memory devices carries a negative charge on its floating gate (viz., a "programmed" cell), overshoot is essentially negligible. FIG. 6 also shows how Dout and Din indicate either a low or high binary state vis-a-vis the sense-reference potential. Din and Dout are relatively lower than their respective reference potentials when indicating a binary low stored on a memory device, and are relatively higher when indicating a binary high.

Figure 8:
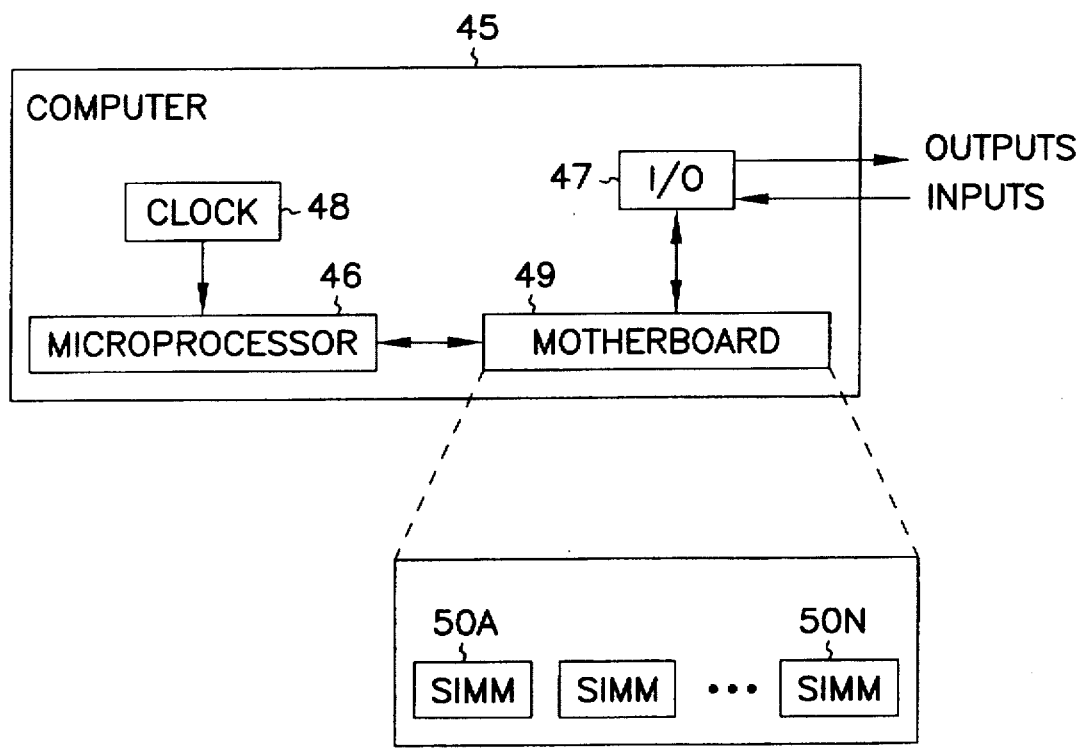
FIG. 8 is a block diagram of a typical computer that may incorporate the present invention.

FIG. 8 is a block diagram of an exemplary computer 45 that may incorporate the present invention. The computer 45 includes a microprocessor 46 and corresponding clock 48. The microprocessor 46 contains the central processing unit (CPU) and associated control circuitry. The microprocessor 46 is connected to a motherboard 49. An I/O interface module 47 is connected to the motherboard 49 and interfaces the microprocessor 46 with peripheral devices such as a monitor and printer. The motherboard 49 also contains a plurality of memory modules for storing data, such as single in-line memory modules (SIMMs) 50A–50N. The motherboard 49 is typically implement with a printed circuit board, and the SIMMs 50A–50N are typically implemented with integrated circuit chips which "plug into" the motherboard 49. A non-volatile memory is usually used on the motherboard 49, SIMMs 50A–50N, or through the I/O interface module 47.

The foregoing description, which has been disclosed by way of the above examples and discussion, addresses preferred embodiments of the present invention encompassing the principles of the present invention. The embodiments may be changed, modified, or implemented using various circuit types and arrangements. For example, the difference amplifier circuit for sensing the difference between the target memory cell and the reference memory cell may be implemented using various forms of active or passive circuits, and the respective circuits providing the input and output signals may be implemented in a number of modified forms. Those skilled in the art will readily recognize that these and various other modifications and changes may be made to the present invention without strictly following the exemplary embodiments and applications illustrated and described herein, without departing from the true spirit and scope of the present invention which is set forth in the following claims.

What is claimed is:

1. A method for sensing the binary state of a floating-gate memory device, comprising the steps of:

discharging a bit line operatively coupled to the floating-gate memory device to a predetermined voltage;

simultaneously raising the potentials of the input and the output of a read-biasing and amplifying circuit, wherein the potential of the output then continues to be raised when the potential of the input is no longer raised;

sensing the potential of the floating-gate memory device with the read-biasing and amplifying circuit;

amplifying the sensed potential at the floating-gate memory device;

comparing the sensed potential at the floating-gate memory device with an amplified predetermined sense-reference potential;

amplifying the difference between the sensed potential at the floating-gate memory device and the amplified predetermined sense-reference potential; and coupling the bit line to the read-biasing and amplifying circuit during the discharging step.

2. A method for sensing the binary state of a floating-gate memory device, comprising the steps of:

discharging a bit line operatively coupled to the floating-gate memory device to a predetermined voltage;

simultaneously raising the potentials of the input and the output of a read-biasing and amplifying circuit, wherein the potential of the output then continues to be raised when the potential of the input is no longer raised;

sensing the potential of the floating-gate memory device with the read-biasing and amplifying circuit;

amplifying the sensed potential at the floating-gate memory device;

comparing the sensed potential at the floating-gate memory device with an amplified predetermined sense-reference potential; and amplifying the difference between the sensed potential at the floating-gate memory device and the amplified predetermined sense-reference potential.

3. A method for operating a memory, comprising the steps of:

discharging a bit line in the memory operatively coupled to the floating-gate memory device in the memory to a predetermined voltage;

simultaneously raising the potentials of the input and the output of a read-biasing and amplifying circuit in the memory, wherein the potential of the output then continues to be raised when the potential of the input is no longer raised;

sensing the potential of the floating-gate memory device with the read-biasing and amplifying circuit;

amplifying the sensed potential at the floating-gate memory device;

comparing the sensed potential at the floating-gate memory device with an amplified predetermined sense-reference potential;

amplifying the difference between the sensed potential at the floating-gate memory device and the amplified predetermined sense-reference potential; and coupling the bit line to the read-biasing and amplifying circuit during the discharging step.

4. A method for operating a memory, comprising the steps of:

discharging a bit line in the memory operatively coupled to the floating-gate memory device in the memory to a predetermined voltage;

simultaneously raising the potentials of the input and the output of a read-biasing and amplifying circuit in the memory, wherein the potential of the output then continues to be raised when the potential of the input is no longer raised;

sensing the potential of the floating-gate memory device with the read-biasing and amplifying circuit;

amplifying the sensed potential at the floating-gate memory device; comparing the sensed potential at the floating-gate memory device with an amplified predetermined sense-reference potential; and amplifying the difference between the sensed potential at the floating-gate memory device and the amplified predetermined sense-reference potential.

5. A method for operating a computer, comprising the steps of:

discharging a bit line in the computer operatively coupled to the floating-gate memory device in the computer to a predetermined voltage;

simultaneously raising the potentials of the input and the output of a read-biasing and amplifying circuit in the computer, wherein the potential of the output then continues to be raised when the potential of the input is no longer raised;

sensing the potential of the floating-gate memory device with the read-biasing and amplifying circuit;

amplifying the sensed potential at the floating-gate memory device;

comparing the sensed potential at the floating-gate memory device with an amplified predetermined sense-reference potential;

amplifying the difference between the sensed potential at the floating-gate memory device and the amplified predetermined sense-reference potential; and coupling the bit line to the read-biasing and amplifing circuit during the discharging step.

6. A method for operating a computer, comprising the steps of:

discharging a bit line in the computer operatively coupled to the floating-gate memory device in the computer to a predetermined voltage;

simultaneously raising the potentials of the input and the output of a read-biasing and amplifying circuit in the computer, wherein the potential of the output then continues to be raised when the potential of the input is no longer raised;

sensing the potential of the floating-gate memory device with the read-biasing and amplifying circuit;

amplifying the sensed potential at the floating-gate memory device;

comparing the sensed potential at the floating-gate memory device with an amplified predetermined sense-reference potential; and amplifying the difference between the sensed potential at the floating-gate memory device and the amplified predetermined sense-reference potential.

\* \* \* \* \*